United States Patent
You et al.

(10) Patent No.: US 6,864,556 B1
(45) Date of Patent: Mar. 8, 2005

(54) CVD ORGANIC POLYMER FILM FOR ADVANCED GATE PATTERNING

(75) Inventors: Lu You, San Jose, CA (US); Marina V. Plat, San Jose, CA (US); Chih Yuh Yang, San Jose, CA (US); Scott A. Bell, San Jose, CA (US); Richard J. Huang, Cupertino, CA (US); Christopher F. Lyons, Fremont, CA (US); Mark S. Chang, Los Altos, CA (US); Marilyn I. Wright, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 10/335,445

(22) Filed: Dec. 31, 2002

Related U.S. Application Data

(60) Provisional application No. 60/400,075, filed on Jul. 31, 2002.

(51) Int. Cl.[7] ................... H01L 21/47; H01L 31/0232
(52) U.S. Cl. ................................ 257/437; 438/636
(58) Field of Search ................... 438/636, 725, 438/758, 780, 952; 257/437, E21.024, E21.029

(56) References Cited

U.S. PATENT DOCUMENTS

| | | | | |
|---|---|---|---|---|
| 6,057,239 A | * | 5/2000 | Wang et al. | 438/689 |
| 6,171,940 B1 | * | 1/2001 | Huang | 438/585 |
| 2002/0086547 A1 | * | 7/2002 | Mui et al. | 438/710 |
| 2004/0018739 A1 | * | 1/2004 | Abooameri et al. | 438/709 |

* cited by examiner

Primary Examiner—Carl Whitehead, Jr.
Assistant Examiner—Jennifer M Dolan
(74) Attorney, Agent, or Firm—Foley & Lardner LLP

(57) ABSTRACT

A bottom anti-reflective coating comprising an organic polymer layer having substantially no nitrogen and a low compressive stress in relation to a polysilicon layer is employed as the lower layer of a bi-layer antireflective coating/hardmask structure to reduce deformation of a pattern to be formed in a patternable layer. The organic polymer layer is substantially transparent to visible radiation, enabling better detection of alignment marks during a semiconductor device fabrication process and improving overlay accuracy. The organic polymer layer provides excellent step coverage and may be advantageously used in the fabrication of structures such as FinFETs.

18 Claims, 2 Drawing Sheets

CVD ORGANIC POLYMER FILM FOR ADVANCED GATE PATTERNING

BACKGROUND OF THE INVENTION

1. Field of the Invention

The present invention pertains integrated circuit fabrication and, in preferred embodiments, to a bottom anti-reflective coating and hard mask for gate patterning and a method for forming the same.

2. Related Art

The escalating requirements for high density and performance associated with ultra large scale integration require responsive changes in conductive patterns, which is considered one of the most demanding aspects of ultra large scale integration technology. High density wiring demands require increasingly denser arrays with minimal spacing between conductive lines. This imposes correspondingly high demands on photolithographic techniques.

Photolithographic techniques form patterns in a photoresist layer using a projected light pattern. However, when a highly reflective substrate such as metal or polysilicon underlies the photoresist layer, reflected light may degrade pattern resolution through several mechanisms. These include off-normal incident light that is reflected into that is intended to be masked, incident light reflected off device features that exposes "notches" in the photoresist, and thin film interference effects leading to linewidth variations when photoresist thickness changes are caused by irregular wafer topography.

These problems are addressed in conventional photolithographic techniques by using an anti-reflective coating (ARC), also characterized as an anti-reflective layer (ARL). This layer is typically positioned between a substrate and a photoresist material. Conventional ARCs are designed, by appropriate adjustment of variables such as composition, deposition conditions and reaction conditions, to provide optical parameters that suppress multiple interference effects caused by the interference of light rays propagating in the same direction due to multiple reflections in the photoresist film. The effective use of an ARC enables patterning and alignment without disturbance caused by such multiple interference, thereby improving line width accuracy and alignment.

It has been found that some line width variations are due to the inability of the ARC to sufficiently reduce reflective layer reflectivity. These reflectivity problems have been addressed by the use of bottom anti-reflective coatings (BARCs) underneath the resists.

In some applications, the BARC serves two functions during semiconductor memory manufacturing: (1) as a hard mask during self-aligned etch (SAE) and during self-aligned-source etch; and (2) as a bottom anti-reflective layer for photolithography at second gate masking.

Silicon oxynitride (SiON) by itself has been used as a BARC material. However, the thickness of SiON required for good hardmask performance is too thick to minimize reflectivity. For example, a typical thickness of a SiON BARC may be 100 nm. This thickness may produce non-uniform line width through lensing effects resulting from variations in the topography of reflective layers under the BARC that are not completely phase cancelled by the BARC. Consequently, a second anti-reflective layer has been used in combination with a SiON layer to improve the performance of the BARC as both a hard mask and a bottom anti-reflective layer for photolithography.

FIG. 1 shows a double layer type BARC using an amorphjous carbon layer. Semiconductor device 100 has a substrate 102. A polysilicon layer 104 with a high reflectivity is formed on substrate 102. The polysilicon layer 104 is to be etched using a BARC as a hard mask. The BARC comprises an amorphous carbon layer 106 and a SiON layer 108. The amorphous carbon layer 106 is formed on top of the polysilicon layer 104. The SiON layer 108 is formed on top of the amorphous carbon layer 106. A photoresist pattern 110 is formed on top of the SiON layer 108 and defines, for example, a line pattern or gate pattern.

A double layer type BARC of the type shown in FIG. 1 has the advantages of allowing the thickness of the anti-reflective layer to be appropriately adjusted to lower the reflectivity and, in addition, allowing the double layer type anti-reflective layer to function as a hard mask for use in an etching process.

However, there are also accompanying disadvantages of the double layer type anti-reflective layer structure shown in FIG. 1. One is that thin nitride layers such as SiON layer 108 are prone to pinhole defects that may affect the reliability of the semiconductor device. One common cause of pinhole defects in a SiON layer is outgassing during the chemical vapor deposition (CVD) process used to form the SiON layer. This outgassing creates localized non-uniformity of the plasma used in the CVD process which results in pinholes in the SiON layer. These pinholes allow nitrogen dopant, which is typically provided in the amorphous carbon to improve the etch selectivity of the amorphous carbon relative to polysilicon, to pass through the SiON layer and contaminate the photoresist. This may prevent the photoresist from being removed during the development process and may result in defects in the pattern subsequently formed in the polysilicon layer or other lithography defects.

Another disadvantage of the semiconductor device 100 shown in FIG. 1 is that there exists a large compressive stress in the amorphous carbon layer 106 that results from large differences in coefficients of thermal expansion (CTE) between the amorphous carbon layer 106, which has a CTE of 3.7 ppm/degree C., and the polysilicon layer 104, which has a CTE of 2.9 ppm/degree C. Because the polysilicon layer 104 contracts to a different degree than the amorphous carbon layer 106 during processing, the amorphous carbon layer 106 is subjected to compressive stress. This stress may cause the patterned amorphous carbon to delaminate from the underlying polysilicon layer and take on a deformed pattern. When the patterned amorphous carbon is subsequently used as a hard mask to pattern the polysilicon layer 104, the deformed pattern is transferred to the polysilicon layer 104.

Yet another disadvantage of the semiconductor device 100 shown in FIG. 1 results from the radiation absorption properties of the amorphous carbon layer 106. One reason for using the amorphous carbon layer 106 in the BARC to absorb ultra-violet (UV) radiation and deep ultra-violet (DUV) radiation. However, amorphous carbon also absorbs radiation in the visible range. This absorption can obscure alignment marks formed on underlying layers that are used to align the various masks formed on the wafer during device fabrication.

These above-described problems make it difficult to control the critical dimensions (CDs) of device features such as transistor gate width, and the alignment of circuit patterns on the wafer. Thus, the semiconductor device may be rejected during a final inspection step due to a deformed pattern on the polysilicon layer or to registration errors.

SUMMARY OF THE DISCLOSURE

Embodiments of the invention address the aforementioned problems by substituting an organic polymer layer for the amorphous carbon layer of the bi-layer structure of FIG. 1. In preferred embodiments, the organic polymer layer comprises an organic polymer selected to have substantially no nitrogen. Thus, there is reduced nitrogen contamination of the photoresist via pinholes in the SiON layer. In addition, the organic polymer is selected to have a small or zero compressive stress. Thus, deformation of the organic polymer layer will be reduced. This will result in a reduction in the deformation of the pattern that will be transferred to the patternable layer. Furthermore, the organic polymer is selected to absorb radiation in the UV and DUV range, but to be substantially transparent to visible radiation. Thus, detection of alignment marks during a semiconductor device fabrication process is not hindered and there are fewer registration errors. The organic polymer is also selected to provide excellent step coverage. Thus, the organic polymer layer may be advantageously used in the fabrication of structures such as, but not limited to, FinFETs.

In accordance with one preferred embodiment of the invention, a patternable layer such as polysilicon or metal is formed over a substrate. An anti-reflective coating is formed over the patternable layer. The anti-reflective coating includes an organic polymer layer formed over the patternable layer. The anti-reflective coating further includes a silicon oxynitride layer formed over the organic polymer layer. A photoresist pattern is formed over the silicon oxynitride layer. The patternable layer may be a polysilicon layer.

In accordance with another preferred embodiment, a gate oxide layer may first be formed on the substrate. The patternable layer may then be formed on the gate oxide layer. An anti-reflective coating is formed over the patternable layer. The anti-reflective coating includes an organic polymer layer formed over the patternable layer. The anti-reflective coating further includes a silicon oxynitride layer formed over the organic polymer layer. A photoresist pattern is formed over the silicon oxynitride layer.

These and other features and advantages of embodiments of the invention will be apparent to those skilled in the art from the following detailed description of embodiments of the invention, when read with the drawings and appended claims.

BRIEF DESCRIPTION OF THE DRAWINGS

Referring now to the drawings in which like reference numbers represent corresponding parts throughout.

DETAILED DESCRIPTION OF PREFERRED EMBODIMENTS

Figure 1:
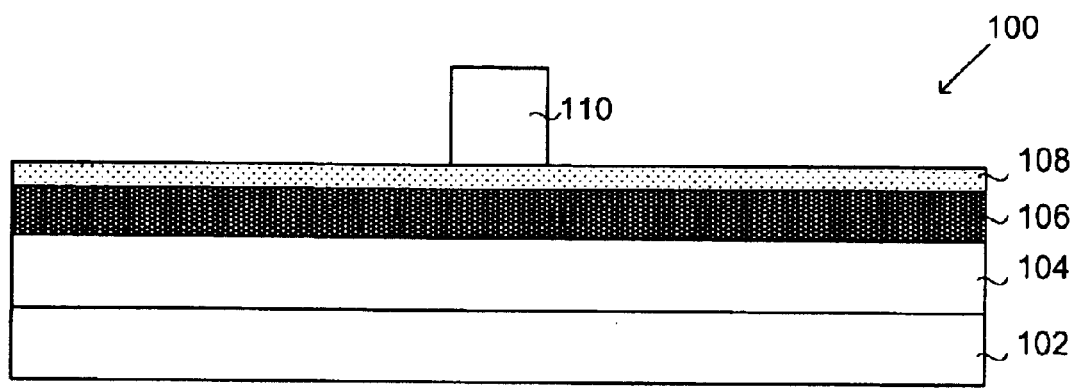
FIG. 1 illustrates a cross-section view of a semiconductor device employing a double layer type anti-reflective coating.

In the following description of preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the invention.

As will be apparent to one of ordinary skill in the art, the processes and structures described below do not necessarily form a complete process flow for manufacturing such devices. However, the present invention can be used in conjunction with conventional technology currently employed in the art, for example integrated circuit fabrication methodology, and, consequently, only so much of the commonly practiced processes are included here as are necessary for an understanding of the present invention. As employed throughout the disclosure and claims, the term "substrate" includes, for example, a semiconductor substrate per se, but may further include one or more layers formed on the semiconductor substrate. Finally, the drawing figures representing cross-sections of portions of a semiconductor device during fabrication processing are not drawn to scale, but instead are drawn as to best illustrate the features of the present invention.

Figure 2:
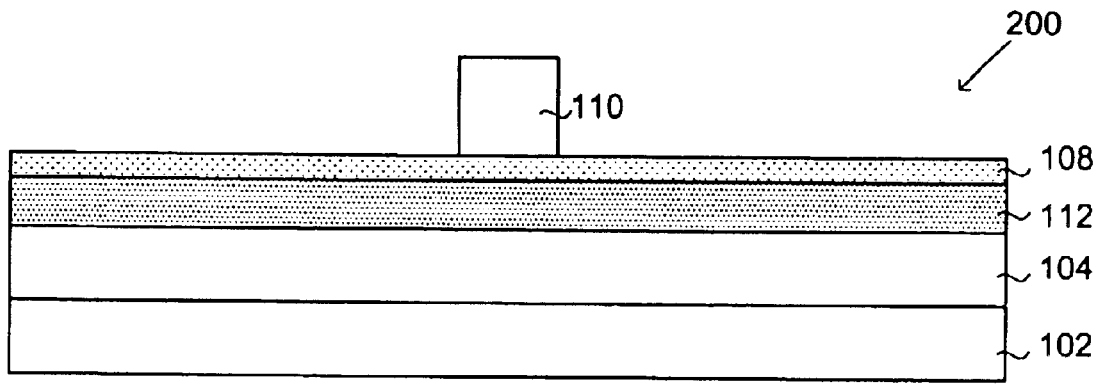
FIG. 2 illustrates a cross-section view of a semiconductor device employing a multi-layered anti-reflective coating having a SiON layer deposited over an organic polymer layer in accordance with a first preferred embodiment of the invention.

FIG. 2 shows a structure formed during fabrication of a semiconductor device in accordance with a first preferred embodiment. The structure 200 includes a patternable layer 104 that is formed above a substrate 102 using suitable deposition techniques. The patternable layer 104 may be, for example, a polysilicon or metal layer. A multi-layered anti-reflective coating is formed over the patternable layer 104. During subsequent stages of the semiconductor device fabrication process, the multi-layered anti-reflective coating is used both as a hard mask and as a bottom anti-reflective layer for photolithography.

The multi-layered anti-reflective coating comprises an organic polymer layer 112 formed on the patternable layer 104 using, for example, a chemical vapor deposition (CVD) process. A SiON layer 108 of the anti-reflective coating is formed over the organic polymer layer 112 using any suitable deposition technique, including, but not limited to, plasma enhanced chemical vapor deposition (PECVD). A photoresist pattern 110 to be used in the photolithographic patterning process is formed over the SiON layer 108. Photoresist 110 is conventionally used to pattern desired features, such as gates, holes, and lines, onto another surface. The photoresist pattern 110 may be formed on the layer 108 by any conventional deposition process, such as a spin-on process followed by lithographic patterning.

The organic polymer layer 112 is preferably selected such that the organic polymer layer 112 has substantially no nitrogen. Thus, the organic polymer layer 112 of semiconductor device 200 stands in contrast to the amorphous carbon layer 106 of semiconductor device 100 shown in FIG. 1. The amorphous carbon layer 106 of semiconductor device 100 contains nitrogen as a dopant used to improve the etch selectivity of the amorphous carbon relative to polysilicon and SiON. Due to the presence of pinholes in the SiON layer, nitrogen tends to contaminate the photoresist 110. As a result, photoresist 110 may not be removed during the development process and there may be defects in the pattern formed on the patternable layer. In contrast, the organic polymer layer 112 of semiconductor device 200 has substantially no nitrogen. As a result, contamination of the photoresist 110 by nitrogen is reduced and defects in the pattern formed on the patternable layer are reduced.

In addition, the organic polymer is preferably selected such that the organic polymer layer 112 has a lower coefficient of thermal expansion (CTE) differential with respect to the patternable layer 104 than amorphous carbon. Thus, the organic polymer layer 112 of semiconductor device 200 stands in contrast to the amorphous carbon layer 106 of semiconductor device 100 shown in FIG. 1. Due to the CTE differential the amorphous carbon layer 106 with respect to the patternable layer 104, the amorphous carbon layer 106 of semiconductor device 100 experiences compressive stress due to thermal effects. This stress may cause the patterned amorphous carbon to delaminate from the underlying patternable and take on a deformed pattern. When the patterned amorphous carbon is subsequently used as a hard mask to pattern the patternable layer 104, the deformed pattern will be transferred to the patternable layer 104. In contrast, compressive stress is reduced in the organic polymer layer 112 due to use in the organic polymer layer 112 of an organic polymer that has a lower coefficient of thermal expansion (CTE) differential with respect to the patternable layer 104 than amorphous carbon. Therefore, compressive stress in the organic polymer layer 112 is relatively lower. This results in reduction in the likelihood of deformation of the pattern transferred to the patternable layer 104.

The organic polymer used in organic polymer layer 112 is also selected to have the property of absorbing radiation in the UV and DUV range, while at the same time being transparent to visible radiation. Thus, the organic polymer layer 112 of semiconductor device 200 stands in contrast to the amorphous carbon layer 106 of semiconductor device 100 shown in FIG. 1. The amorphous carbon layer 106 of semiconductor device 100 absorbs visible radiation, as well as UV and DUV radiation. Thus, during the semiconductor device fabrication process, the detection of alignment marks by a stepper may be hindered because of the opaqueness of the amorphous carbon layer 106. As a result, the overlay accuracy of various layers may be compromised and registration errors may occur. In contrast, the organic polymer layer 112 of semiconductor device 200 provides the same advantageous UV and DUV absorption properties of the amorphous carbon layer 106, but is, in addition, advantageously transparent to visible radiation. Thus, the organic polymer layer may be used in a BARC to reduce reflection of UV and DUV radiation while at the same time being transparent to visible radiation used by a stepper to detect alignment marks. As a result, the overlay accuracy of the various layers of semiconductor device 200 is advantageously improved and registration errors are reduced.

Furthermore, the organic polymer used in organic polymer layer 112 is selected such that the organic polymer layer 112 provides excellent step coverage. Thus, the organic polymer layer may be advantageously used in the fabrication of structures such as, but not limited to, FinFETs.

The organic polymer is preferably a gas phase deposition polymer, for example a CVD organic polymer, such as poly-p-xylylene, BCB (produced by Dow Chemical), or teflon AF (produced by DuPont).

While the structure described above is presently preferred, in alternative embodiments the structure may further include a gate insulating layer such as an oxide layer formed between the patternable layer 104 and the substrate 102. In such embodiments the structure described above may for example be used to pattern gate lines of a MOSFET.

Figure 3:
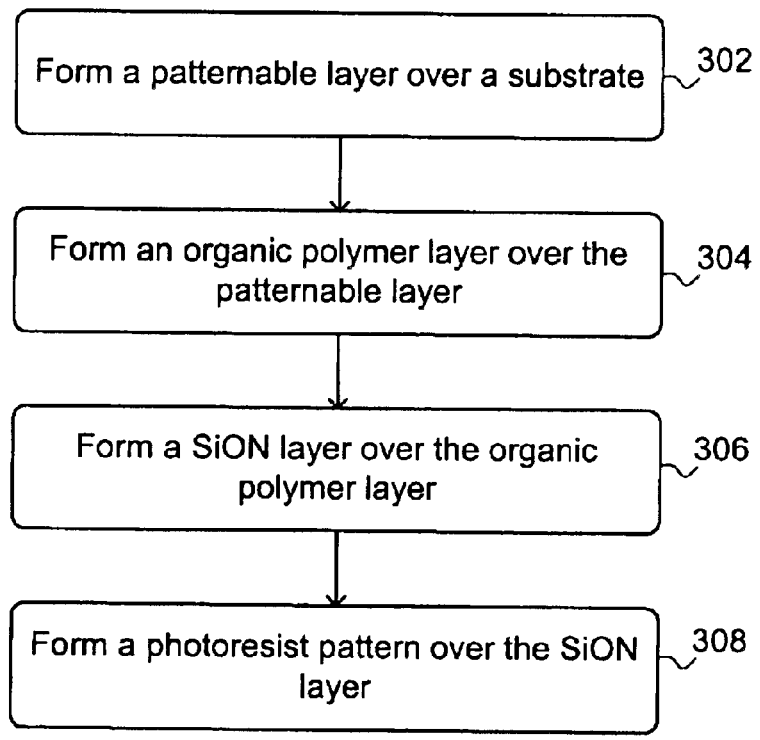
FIG. 3 shows a process flow encompassing the first preferred embodiment and alternative embodiments.

FIG. 3 shows a process flow encompassing the first preferred embodiment and the aforementioned alternative embodiments as well as further alternative embodiments. Initially a patternable layer is formed over a substrate (302). An organic polymer layer is then formed over the patternable layer (304). A SiON layer is then formed over the organic polymer layer (306). Subsequently a photoresist pattern is formed over the SiON layer (308).

In the previous description, numerous specific details are set forth, such a specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A structure formed during manufacture of a semiconductor device, the structure comprising:
    a patternable layer formed above a substrate;
    an antireflective coating comprising an organic polymer layer of poly-p-xylylene formed over the patternable layer, and a silicon oxynitride layer formed over the organic polymer layer; and
    a photoresist pattern formed over the silicon oxynitride layer.

2. The structure recited in claim 1, wherein the organic polymer layer absorbs radiation in the ultra-violet and deep ultra-violet range.

3. The structure recited in claim 1 wherein the organic polymer layer is substantially transparent to visible radiation.

4. The structure recited in claim 1, wherein the organic polymer layer has substantially no nitrogen.

5. The structure recited in claim 1, wherein the organic polymer layer comprises a gas phase depositable organic polymer.

6. The structure recited in claim 1, wherein the patternable layer is a polysilicon layer.

7. The structure recited in claim 6, wherein the organic polymer layer has a lower coefficient of thermal expansion differential with respect to the patternable layer than amorphous carbon layer.

8. The structure recited in claim 1, wherein the organic polymer layer is formed by a Chemical Vapor Deposition (CVD) process.

9. The structure recited in claim 1, further comprising an oxide layer formed between the substrate and the patternable layer.

10. A method of fabricating a semiconductor device having a multi-layered anti-reflective coating, the method comprising:
    forming a patternable layer above a substrate;
    forming an organic polymer layer of the anti-reflective coating over the patternable layer, wherein the organic polymer is poly-p-xylylene;
    forming a silicon oxynitride layer of the anti-reflective coating over the organic polymer layer; and
    forming a photoresist pattern over the silicon oxynitride layer.

11. The method recited in claim 10, wherein the organic polymer layer absorbs radiation in the ultra-violet and deep ultra-violet range.

12. The method recited in claim 10, wherein the organic polymer layer is substantially transparent to visible radiation.

13. The method recited in claim 10, wherein the organic polymer layer has substantially no nitrogen.

14. The method recited in claim 10, wherein the organic polymer layer comprises a gas phase depositable organic polymer.

15. The method recited in claim 10, wherein the patternable layer is a polysilicon layer.

16. The method recited in claim 15, wherein the organic polymer layer has a lower coefficient of thermal expansion differential with respect to the patternable layer than amorphous carbon layer.

17. The method recited in claim 10, wherein the organic polymer layer is formed by a Chemical Vapor Deposition (CVD) process.

18. The method recited in claim 10, wherein forming a patternable layer above a substrate further comprises forming the patternable layer on an oxide layer formed on the substrate.

* * * * *